(12) United States Patent
Sutardja et al.

(10) Patent No.: US 9,543,236 B2
(45) Date of Patent: Jan. 10, 2017

(54) PAD CONFIGURATIONS FOR AN ELECTRONIC PACKAGE ASSEMBLY

(71) Applicant: Marvell World Trade Ltd., St. Michael (BB)

(72) Inventors: Sehat Sutardja, Los Altos Hills, CA (US); Shiann-Ming Liou, Campbell, CA (US); Huahung Kao, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 15/137,776

(22) Filed: Apr. 25, 2016

(65) Prior Publication Data

US 2016/0240459 A1    Aug. 18, 2016

Related U.S. Application Data

(60) Continuation of application No. 14/511,948, filed on Oct. 10, 2014, now Pat. No. 9,331,052, which is a
(Continued)

(51) Int. Cl.
*H01L 23/495*   (2006.01)
*H01L 23/31*    (2006.01)
(Continued)

(52) U.S. Cl.
CPC ..... *H01L 23/49503* (2013.01); *H01L 21/4825* (2013.01); *H01L 21/565* (2013.01);
(Continued)

(58) Field of Classification Search
CPC .............. H01L 2224/48227; H01L 2224/4824;
H01L 2224/49433; H01L 2224/73204; H01L 2224/83192; H01L 2224/83194; H01L 2225/0651; H01L 2225/06586; H01L 23/49503; H01L 23/49541; H01L 23/49575; H01L 23/498
(Continued)

(56) References Cited

U.S. PATENT DOCUMENTS 5,148,265 A * 9/1992 Khandros ........... H01L 21/6836
257/668
5,889,324 A * 3/1999 Suzuki ................ H01L 23/3128
257/675
(Continued)

FOREIGN PATENT DOCUMENTS

CN   101416303 A   4/2009
CN   101587868 A   11/2009

*Primary Examiner* — William F Kraig
*Assistant Examiner* — Edward Chin

(57) ABSTRACT

Embodiments of the present disclosure provide an electronic package assembly comprising a solder mask layer, the solder mask layer having at least one opening, and a plurality of pads coupled to the solder mask layer, wherein at least one pad of the plurality of pads includes (i) a first side, (ii) a second side, the first side being disposed opposite to the second side, (iii) a terminal portion and (iv) an extended portion, wherein the first side at the terminal portion is configured to receive a package interconnect structure through the at least one opening in the solder mask layer, the package interconnect structure to route electrical signals between a die and another electronic device that is external to the electronic package assembly, and wherein the second side at the extended portion is configured to receive one or more electrical connections from the die.

20 Claims, 5 Drawing Sheets

Related U.S. Application Data division of application No. 13/153,181, filed on Jun. 3, 2011, now Pat. No. 8,860,193.

(60) Provisional application No. 61/351,471, filed on Jun. 4, 2010.

(51) Int. Cl.
*H01L 21/48* (2006.01)
*H01L 21/56* (2006.01)

(52) U.S. Cl.
CPC ...... *H01L 23/3114* (2013.01); *H01L 23/4952* (2013.01); *H01L 23/49541* (2013.01)

(58) Field of Classification Search
USPC ......... 257/E23.052, E25.013, 676, 678, 784, 257/786, E21.511, E23.067, E23.068
See application file for complete search history.

(56) References Cited

U.S. PATENT DOCUMENTS

| | | | | |
|---|---|---|---|---|
| 5,977,615 | A * | 11/1999 | Yamaguchi | H01L 23/3107 257/666 |
| 6,040,984 | A * | 3/2000 | Hirakawa | H01L 23/5386 174/261 |
| 6,201,707 | B1 * | 3/2001 | Sota | H01L 23/49816 174/260 |
| 6,225,146 | B1 * | 5/2001 | Yamaguchi | H01L 23/3107 257/E23.049 |
| 6,720,207 | B2 * | 4/2004 | Minamio | H01L 21/4821 257/666 |
| 6,723,584 | B2 * | 4/2004 | Kovac | H01L 21/56 257/E21.502 |
| 6,809,405 | B2 * | 10/2004 | Ito | H01L 21/4821 257/666 |
| 6,906,414 | B2 * | 6/2005 | Zhao | H01L 23/13 257/706 |
| 6,984,880 | B2 * | 1/2006 | Minamio | H01L 21/4821 257/666 |
| 7,060,535 | B1 * | 6/2006 | Sirinorakul | H01L 21/4832 257/702 |
| 7,208,817 | B2 * | 4/2007 | Ito | H01L 21/565 257/666 |
| 7,250,684 | B2 * | 7/2007 | Nickerson | B23K 20/004 228/180.5 |
| 7,323,767 | B2 * | 1/2008 | James | H01L 21/561 257/678 |
| 7,339,259 | B2 * | 3/2008 | Ito | H01L 21/565 257/666 |
| 7,459,765 | B2 * | 12/2008 | Terui | H01L 23/3128 257/532 |
| 7,656,019 | B2 * | 2/2010 | Tsutsumi | H01L 23/49838 257/678 |
| 7,808,110 | B2 * | 10/2010 | Wang | H01L 23/49838 257/4 |
| 7,879,655 | B2 * | 2/2011 | Tsutsumi | H01L 23/49838 257/E23.039 |
| 8,044,496 | B2 * | 10/2011 | Hsieh | H01L 21/4832 257/673 |
| 8,124,447 | B2 * | 2/2012 | Chang Chien | H01L 21/4832 257/E21.502 |
| 2002/0079562 | A1 * | 6/2002 | Zhao | H01L 23/4334 257/678 |
| 2003/0111726 | A1 * | 6/2003 | Khan | H01L 23/13 257/730 |
| 2004/0169292 | A1 * | 9/2004 | James | H01L 21/561 257/786 |
| 2005/0139986 | A1 * | 6/2005 | Kovac | H01L 21/56 257/698 |
| 2005/0212129 | A1 * | 9/2005 | Huang | H01L 23/3128 257/737 |
| 2007/0077414 | A1 | 4/2007 | Rudiger et al. | |
| 2008/0153204 | A1 * | 6/2008 | Jackson | H01L 21/76898 438/109 |
| 2008/0185726 | A1 | 8/2008 | Wang et al. | |
| 2009/0283882 | A1 | 11/2009 | Hsieh et al. | |
| 2010/0112761 | A1 | 5/2010 | Tsutsumi et al. | |
| 2011/0042794 | A1 * | 2/2011 | Hsieh | H01L 21/4832 257/676 |
| 2011/0298117 | A1 * | 12/2011 | Sutardja | H01L 21/568 257/676 |
| 2012/0007224 | A1 * | 1/2012 | Hasebe | H01L 23/3107 257/676 |
| 2012/0018859 | A1 * | 1/2012 | Tashiro | B29C 45/0046 257/666 |
| 2012/0074544 | A1 * | 3/2012 | Masuda | H01L 21/4832 257/673 |

* cited by examiner

PAD CONFIGURATIONS FOR AN ELECTRONIC PACKAGE ASSEMBLY

CROSS REFERENCE TO RELATED APPLICATIONS

The present disclosure is a continuation of and claims priority to U.S. patent application Ser. No. 14/511,948, filed Oct. 10, 2014, now U.S. Pat. No. 9,331,052, issued May 3, 2016, which is a divisional of and claims priority to U.S. patent application Ser. No. 13/153,181, filed Jun. 3, 2011, now U.S. Pat. No. 8,860,193, issued Oct. 14, 2014, which claims priority to U.S. Provisional Patent Application No. 61/351,471, filed Jun. 4, 2010, which are incorporated herein by reference.

TECHNICAL FIELD

Embodiments of the present disclosure relate to the field of electronic package assemblies, and more particularly, to techniques, structures, and configurations of pads for electronic package assemblies.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Integrated circuit devices, such as transistors, are formed on dies or chips that continue to scale in size to smaller dimensions. The shrinking dimensions of the dies and associated packaging assemblies that house the dies are challenging conventional pad structures and pad configurations that are currently used to route electrical signals to or from the semiconductor die.

SUMMARY

In one embodiment, the present disclosure includes an electronic package assembly comprising a solder mask layer, the solder mask layer having at least one opening, and a plurality of pads coupled to the solder mask layer, wherein at least one pad of the plurality of pads includes (i) a first side, (ii) a second side, the first side being disposed opposite to the second side, (iii) a terminal portion and (iv) an extended portion, wherein the first side at the terminal portion is configured to receive a package interconnect structure through the at least one opening in the solder mask layer, the package interconnect structure to route electrical signals between a die and another electronic device that is external to the electronic package assembly, and wherein the second side at the extended portion is configured to receive one or more electrical connections from the die.

In another embodiment, the present disclosure includes an apparatus comprising an electronic package assembly comprising a solder mask layer, the solder mask layer having at least one opening, and a plurality of pads coupled to the solder mask layer, wherein at least one pad of the plurality of pads includes (i) a first side, (ii) a second side, the first side being disposed opposite to the second side, (iii) a terminal portion and (iv) an extended portion, wherein the first side at the terminal portion is configured to receive a package interconnect structure through the at least one opening in the solder mask layer, and wherein the second side at the extended portion is configured to receive one or more electrical connections from a die, and a printed circuit board coupled to the first side at the terminal portion of the at least one pad using the package interconnect structure, the package interconnect structure to route electrical signals between the die and the printed circuit board.

In another embodiment, the present disclosure includes an electronic package assembly comprising a solder mask layer, wherein the solder mask layer has one or more openings. The electronic package assembly further comprises a plurality of pads coupled to the solder mask layer, wherein each of at least two pads of the plurality of pads includes (i) a first side, (ii) a second side, the first side being disposed opposite to the second side, (iii) a terminal portion and (iv) an extended portion. The first side at the terminal portion is configured to receive a package interconnect structure through the one or more openings in the solder mask layer. The package interconnect structure routes electrical signals between a die and another electronic device that is external to the electronic package assembly, and the second side at the extended portion is configured to receive one or more electrical connections from the die. The electronic package assembly further comprises a die pad configured to receive the die. The plurality of pads includes a first row of pads, with the first row of pads being disposed adjacent to the die pad. The plurality of pads includes a second row of pads disposed adjacent and parallel to the first row of pads, with the first row of pads being disposed closer to the die pad than the second row of pads. A first pad of the at least two pads is disposed in the first row of pads and a second pad of the at least two pads is disposed in the second row of pads.

In yet another embodiment, the present disclosure provides a method of fabricating an electronic package assembly, where the method comprises providing a sacrificial substrate and forming a redistribution layer on the sacrificial substrate. The redistribution layer includes a plurality of pads and a die pad configured to receive a die. Each of at least two pads of the plurality of pads includes (i) a first side, (ii) a second side, the first side being disposed opposite to the second side, (iii) a terminal portion and (iv) an extended portion. The first side at the terminal portion is coupled to the sacrificial substrate and the second side at the extended portion is configured to receive one or more electrical connections from the die. The plurality of pads includes a first row of pads, the first row of pads being disposed adjacent to the die pad. The plurality of pads includes a second row of pads disposed adjacent and parallel to the first row of pads, the first row of pads being disposed closer to the die pad than the second row of pads. A first pad of the at least two pads is disposed in the first row of pads and a second pad of the at least two pads is disposed in the second row of pads.

In another embodiment, the present disclosure provides an electronic package assembly comprising a solder mask layer. The solder mask layer has at least one opening. The electronic package assembly further comprises a plurality of pads coupled to the solder mask layer. At least one pad of the plurality of pads includes (i) a first side, (ii) a second side, the first side being disposed opposite to the second side, (iii) a terminal portion and (iv) an extended portion. The first side at the terminal portion is configured to receive a package interconnect structure through the at least one opening in the solder mask layer. The package interconnect structure routes electrical signals between a die and another electronic device that is external to the electronic package assembly.

The second side at the extended portion is configured to receive one or more electrical connections from the die. The electronic package assembly further comprises a die pad configured to receive the die. The plurality of pads includes a first row of pads, the first row of pads being disposed adjacent to the die pad. The plurality of pads includes a second row of pads disposed adjacent and parallel to the first row of pads, the first row of pads being disposed closer to the die pad than the second row of pads. The extended portion of the at least one pad extends in a direction that is not perpendicular to the first row of pads.

In yet another embodiment, the present disclosure provides a method of fabricating an electronic package assembly, where the method comprises providing a sacrificial substrate and forming a redistribution layer on the sacrificial substrate. The redistribution layer includes a plurality of pads and a die pad configured to receive a die. At least one pad of the plurality of pads includes (i) a first side, (ii) a second side, the first side being disposed opposite to the second side, (iii) a terminal portion and (iv) an extended portion. The first side at the terminal portion is coupled to the sacrificial substrate and the second side at the extended portion is configured to receive one or more electrical connections from the die. The plurality of pads includes a first row of pads, the first row of pads being disposed adjacent to the die pad. The plurality of pads includes a second row of pads disposed adjacent and parallel to the first row of pads, the first row of pads being disposed closer to the die pad than the second row of pads. The extended portion of the at least one pad extends in a direction that is not perpendicular to the first row of pads.

In another embodiment, the present disclosure provides an electronic package assembly comprising a solder mask layer. The solder mask layer has at least one opening. The electronic package assembly further comprises a plurality of pads coupled to the solder mask layer. At least one pad of the plurality of pads includes (i) a first side, (ii) a second side, with the first side being disposed opposite to the second side, (iii) a terminal portion and (iv) an extended portion. The first side at the terminal portion is configured to receive a package interconnect structure through the at least one opening in the solder mask layer. The package interconnect structure routes electrical signals between a die and another electronic device that is external to the electronic package assembly. The second side at the extended portion is configured to receive one or more electrical connections from the die. The electronic package assembly further comprises a die pad configured to receive the die. The plurality of pads includes a first row of pads, the first row of pads being disposed adjacent to the die pad. The plurality of pads includes a second row of pads disposed adjacent and parallel to the first row of pads, the first row of pads being disposed closer to the die pad than the second row of pads. The plurality of pads includes a third row of pads disposed adjacent and parallel to the second row of pads, the second row of pads being disposed closer to the die pad than the third row of pads. The extended portion has a terminating end that is disposed between the first row of pads and the second row of pads.

In another embodiment, the present disclosure provides a method of fabricating an electronic package assembly, where the method comprises providing a sacrificial substrate and forming a redistribution layer on the sacrificial substrate. The redistribution layer includes a plurality of pads and a die pad configured to receive a die. At least one pad of the plurality of pads includes (i) a first side, (ii) a second side, with the first side being disposed opposite to the second side, (iii) a terminal portion and (iv) an extended portion. The first side at the terminal portion is coupled to the sacrificial substrate and the second side at the extended portion is configured to receive one or more electrical connections from the die. The plurality of pads includes a first row of pads, the first row of pads being disposed adjacent to the die pad. The plurality of pads includes a second row of pads disposed adjacent and parallel to the first row of pads, the first row of pads being disposed closer to the die pad than the second row of pads. The plurality of pads includes a third row of pads disposed adjacent and parallel to the second row of pads, the second row of pads being disposed closer to the die pad than the third row of pads. The extended portion has a terminating end that is disposed between the first row of pads and the second row of pads.

In yet another embodiment, the present disclosure provides an electronic package assembly comprising a solder mask layer. The solder mask layer has at least one opening. The electronic package assembly further comprises a plurality of pads coupled to the solder mask layer. One or more pads of the plurality of pads includes (i) a first side, (ii) a second side, with the first side being disposed opposite to the second side, (iii) a terminal portion and (iv) an extended portion. The first side at the terminal portion is configured to receive a package interconnect structure through the at least one opening in the solder mask layer. The package interconnect structure routes electrical signals between a die and another electronic device that is external to the electronic package assembly. The second side at the extended portion is configured to receive one or more electrical connections from the die. The electronic package assembly further comprises a die pad configured to receive the die. The plurality of pads includes a first row of pads, the first row of pads being disposed adjacent to the die pad. The plurality of pads includes a second row of pads disposed adjacent and parallel to the first row of pads, the first row of pads being disposed closer to the die pad than the second row of pads. The plurality of pads includes a third row of pads disposed adjacent and parallel to the second row of pads, the second row of pads being disposed closer to the die pad than the third row of pads. The extended portion extends in substantially all directions away from the terminal portion on a plane that includes the plurality of pads.

In another embodiment, the present disclosure provides a method of fabricating an electronic package assembly, where the method comprises providing a sacrificial substrate and forming a redistribution layer on the sacrificial substrate. The redistribution layer includes a plurality of pads and a die pad configured to receive a die. One or more pads of the plurality of pads includes (i) a first side, (ii) a second side, with the first side being disposed opposite to the second side, (iii) a terminal portion and (iv) an extended portion. The first side at the terminal portion is coupled to the sacrificial substrate and the second side at the extended portion is configured to receive one or more electrical connections from the die. The plurality of pads includes a first row of pads, the first row of pads being disposed adjacent to the die pad. The plurality of pads includes a second row of pads disposed adjacent and parallel to the first row of pads, the first row of pads being disposed closer to the die pad than the second row of pads. The plurality of pads includes a third row of pads disposed adjacent and parallel to the second row of pads, the second row of pads being disposed closer to the die pad than the third row of pads. The extended portion extends in substantially all directions away from the terminal portion.

In another embodiment, the present disclosure provides an electronic package assembly comprising a solder mask layer. The solder mask layer has at least one opening. The electronic package assembly further comprises a plurality of pads coupled to the solder mask layer. At least one pad of the plurality of pads includes (i) a first side, (ii) a second side, with the first side being disposed opposite to the second side, (iii) a terminal portion and (iv) an extended portion. The first side at the terminal portion is configured to receive a package interconnect structure through the at least one opening in the solder mask layer. The package interconnect structure routes electrical signals between a die and another electronic device that is external to the electronic package assembly. The second side at the extended portion is configured to receive one or more electrical connections from the die. The electronic package assembly further comprises a die pad configured to receive the die and one or more ring segment structures disposed adjacent to the die pad. The one or more ring segment structures provide power and/or ground connections for the die.

In yet another embodiment, the present disclosure provides a method of fabricating an electronic package assembly, where the method comprises providing a sacrificial substrate and forming a redistribution layer on the sacrificial substrate. The redistribution layer includes (i) a plurality of pads (ii) a die pad configured to receive a die and (iii) one or more ring segment structures disposed adjacent to the die pad. The one or more ring segment structures are configured to provide power and/or ground connections for the die. One or more pads of the plurality of pads includes (i) a first side, (ii) a second side, with the first side being disposed opposite to the second side, (iii) a terminal portion and (iv) an extended portion. The first side at the terminal portion is coupled to the sacrificial substrate and the second side at the extended portion is configured to receive one or more electrical connections from the die.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments herein are illustrated by way of example and not by way of limitation in the figures of the accompanying drawings.

DETAILED DESCRIPTION

Embodiments of the present disclosure describe techniques, structures, and configurations of pads for electronic package assemblies. In the following detailed description, reference is made to the accompanying drawings which form a part hereof, wherein like numerals designate like parts throughout. Other embodiments may be utilized and structural or logical changes may be made without departing from the scope of the present disclosure. Therefore, the following detailed description is not to be taken in a limiting sense, and the scope of embodiments is defined by the appended claims and their equivalents.

Figure 1:
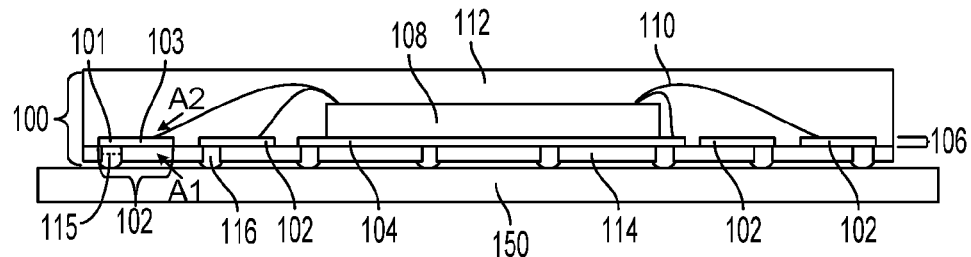
FIG. 1 schematically illustrates a cross-section view of an electronic package assembly coupled to a printed circuit board.

FIG. 1 schematically illustrates a cross-section view of an electronic package assembly 100 coupled to a printed circuit board 150. The electronic package assembly 100 includes a solder mask layer 114 and one or more redistribution layers 106, coupled as shown.

The solder mask layer 114 generally comprises a solder resist material such as, for example, an epoxy. Other suitable electrically insulative materials can be used to fabricate the solder mask layer 114 in other embodiments. One or more openings 115, which may also be referred to as solder resist openings, are formed in the solder mask layer 114 to provide access to the one or more redistribution layers 106.

The one or more redistribution layers 106 are configured to route electrical signals of one or more dies 108 of the electronic package assembly 100. For example, the one or more redistribution layers 106 can provide routing of input/output (I/O) and/or power/ground signals between the one or more dies 108 and one or more package interconnect structures 116.

The one or more redistribution layers 106 generally include an electrically conductive material such as, for example, a metal (e.g., copper or aluminum). Other suitable electrically conductive materials can be used to form the one or more redistribution layers 106 in other embodiments.

In an embodiment, the one or more redistribution layers 106 include a plurality of pads 102 and a die pad 104. In some embodiments, the pads 102 and the die pad 104 are part of a same redistribution layer of the one or more redistribution layers 106, as can be seen.

The pads 102 generally have a first side, A1, and a second side, A2, that is disposed opposite to the first side A1. The first side A1 and the second side A2 generally refer to opposing surfaces of the pads 102 to facilitate the description of various configurations described herein.

At least one pad of the plurality of pads 102 includes a terminal portion 101 and an extended portion 103. The terminal portion 101 is configured to receive at least one package interconnect structure of the one or more package interconnect structures 116. That is, the first side A1 of the terminal portion 101 serves as a landing pad for the one or more package interconnect structures 116, as can be seen. The one or more package interconnect structures 116 can be directly bonded to first side A1 of the terminal portion 101 through the one or more openings 115 formed in the solder mask layer 114.

The extended portion 103 is configured to receive one or more electrical connections from the one or more dies 108.

In an embodiment, one or more bonding wires 110 are coupled to the second side A2 of the extended portion 103 to route the electrical signals of the one or more dies 108.

One or more dies 108 are coupled to the one or more redistribution layers 106. In an embodiment, the one or more dies 108 are attached to the die pad 104. The die pad 104 includes a surface upon which the one or more dies 108 are attached. The one or more dies 108 can be coupled to the die pad 104 using any suitable technique such as, for example, a die adhesive technique.

The one or more dies 108 generally comprise a semiconductor material, such as, for example, silicon. The one or more dies 108 generally have an active side that includes a surface upon which a plurality of integrated circuit (IC) devices (not shown) such as transistors for logic and/or memory are formed and an inactive side that is disposed opposite to the active side. The active side of the one or more dies 108 is electrically coupled to the one or more redistribution layers 106 using the one or more bonding wires 110, as can be seen.

In some embodiments, the die pad 104 serves as a ground pad to provide an electrical ground connection for the one or more dies 108. The one or more dies 108 can be electrically coupled to the die pad 104 using the one or more bonding wires 110, as can be seen.

A molding compound 112 is formed to substantially encapsulate the one or more dies 108, the one or more bonding wires 110, and the pads 102, as can be seen. The molding compound 112 generally comprises an electrically insulative material, such as a thermosetting resin, that is disposed to protect the one or more dies 108 and other components of the electronic package assembly 100 from moisture, oxidation, or chipping associated with handling.

The electronic package assembly 100 is electrically coupled to another electronic device that is external to the electronic package assembly 100 such as a printed circuit board 150. The printed circuit board 150 can include a motherboard in some embodiments.

The electronic package assembly 100 is electrically coupled to the printed circuit board 150 using the one or more package interconnect structures 116. The one or more package interconnect structures 116 generally comprise an electrically conductive material such as a metal. The one or more package interconnect structures 116 can be formed in a variety of shapes including spherical, planar, or polygon shapes and can be positioned in a variety of positions including in a row or in an array of multiple rows. In an embodiment, the one or more package interconnect structures 116 comprise solder balls.

According to various embodiments, the electronic package assembly 100 can be configured in a ball-grid array, pin-grid array, land-grid array, thin quad flat pack, dual in-line, mix-type leadframe ball (MLB) array, or suitable combinations thereof. Other suitable package configurations can be used in other embodiments.

The pads 102 of the electronic package assembly 100 can be arranged in a variety of ways to provide a variety of benefits. For example, pad structures and/or configurations described herein can allow or facilitate reduced bonding wire lengths, increased number of I/O structures (e.g., pads) for the electronic package assembly 100, increased flexibility of selecting a bond location (e.g., bonding wire angle, clearance) owing to the increased area or particular positioning of the pads 102 for bonding, multiple bonding of bond wires to the same pad, and/or use of a single electronic package layout to be useable for multiple different applications, or combinations thereof. FIGS. 2A-7 depict some example pad configurations that can be used according to various embodiments.

Figure 2A:
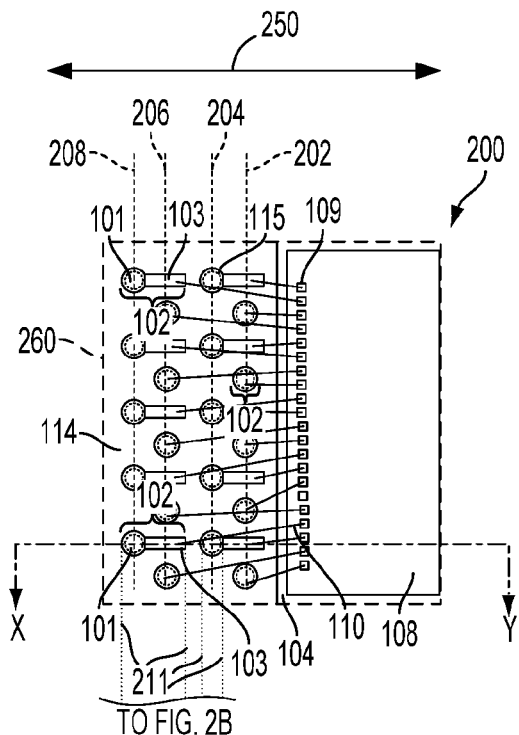
FIG. 2A schematically illustrates a top view of a portion of an electronic package assembly having a pad configuration.

FIG. 2A schematically illustrates a top view of a portion 260 of an electronic package assembly 200 having a pad configuration. Molding compound is not depicted for the sake of clarity.

The electronic package assembly 200 includes one or more dies 108 having a plurality of bond pads 109. The bond pads 109 of the one or more dies 108 are electrically coupled to respective pads 102 using one or more bonding wires 110. An end of the one or more bonding wires 110 can be directly coupled to the bond pads 109 and another end of the one or more bonding wires 110 can be directly coupled to the terminal portion 101 or the extended portion 103 of the pads 102, as can be seen.

A first row 202 of pads 102 is disposed adjacent to the die pad 104, as can be seen. A second row 204 of pads 102 is disposed adjacent and parallel to the first row 202, a third row 206 of pads 102 is disposed adjacent and parallel to the second row 204, and a fourth row 208 of pads 102 is disposed adjacent and parallel to the third row 206, as can be seen. The first row 202 is disposed closer to the die pad 104 than the second row 204, the second row 204 of pads 102 is disposed closer to the die pad 104 than the third row 206, and the third row 206 of pads is disposed closer to the die pad 104 than the fourth row 208, as can be seen. Additional rows of pads can be used in other embodiments.

Pads 102 in the first row 202 and the third row 206 are staggered relative to pads 102 in the second row 204 and the fourth row 208, as can be seen. That is, the terminal portion 101 of pads 102 in the first row 202 and the third row 206 are not aligned with the terminal portion 101 of pads 102 in the second row 204 and the fourth row 208 in a direction that is substantially perpendicular to the rows 202, 204, 206, 208. The direction that is substantially perpendicular to the rows 202, 204, 206, 208 is indicated by arrow 250. The pads 102 in the first row 202 and the third row 206 only include a terminal portion 101 and the pads 102 in the second row 204 and the fourth row 208 include both a terminal portion 101 and an extended portion 103, as can be seen.

The extended portion 103 of the pads 102 in the second row 204 and the fourth row 208 extends from the terminal portion 101 to a position between pads 102 in the first row 202 and the third row 206, respectively, the extended portion 103 extending in a direction towards the die pad 104 and/or the one or more dies 108. The extended portion 103 may extend in a direction that is substantially perpendicular to a terminating edge of the one or more dies 108, the terminating edge being adjacent and parallel to the first row 202 of pads, as can be seen. The depicted terminal portion 101 is circular and the extended portion 103 is elongate and substantially rectangular. Other suitable shapes for the terminal portion 101 and the extended portion 103 can be used in other embodiments.

The one or more openings 115 formed in the solder mask layer 114 are depicted in dashed form to indicate that the one or more openings 115 underlie the terminal portion 101 of the pads 102 in the top view of FIG. 2A. Although the depicted portion 260 of the electronic package assembly 200 only shows a configuration of the pads 102 adjacent to one of the terminating edges of the one or more dies 108, it should be understood that the pads 102 and the bond pads 109 can be similarly configured along other or all terminating edges of the one or more dies 108.

Figure 2B:
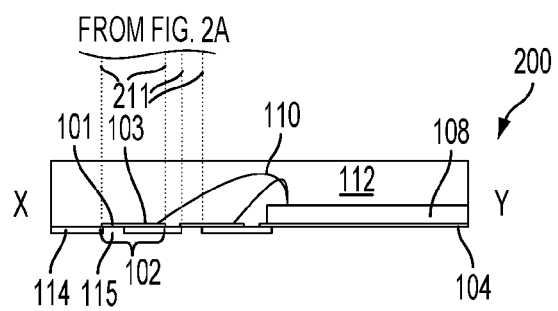
FIG. 2B schematically illustrates a cross-section view of the portion of the electronic package assembly depicted in FIG. 2A.

FIG. 2B schematically illustrates a cross-section view of the portion 260 of the electronic package assembly 200 along segment XY of FIG. 2A. Lines 211 of FIG. 2B generally correspond to lines 211 of FIG. 2A, which are used to generally indicate common dimensions of the pads 102 in FIG. 2A and FIG. 2B. The electronic package assembly 200 includes a plurality of pads 102 having a terminal portion 101 and an extended portion, die pad 104, one or more dies 108, one or more bonding wires 110, molding compound 112, and solder mask layer 114 having one or more openings 115, coupled as shown.

Figure 3:
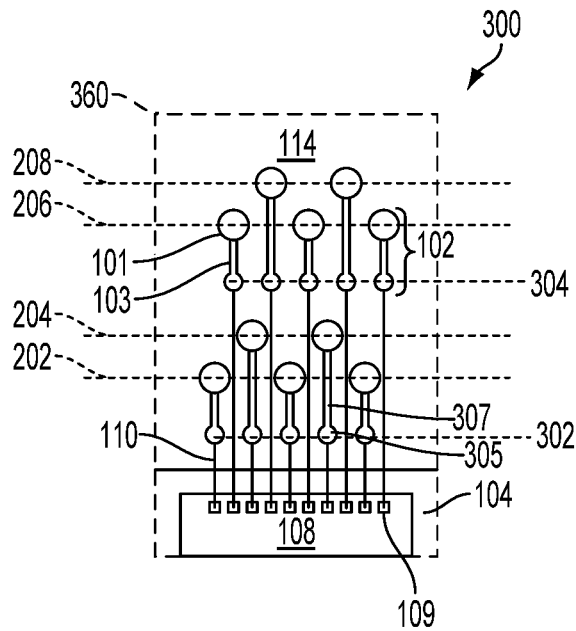
FIG. 3 schematically illustrates a top view of a portion of an electronic package assembly having another pad configuration.

FIG. 3 schematically illustrates a top view of a portion 360 of an electronic package assembly 300 having another pad configuration. The electronic package assembly 300 includes a plurality of pads 102 arranged in a first row 202, a second row 204, a third row 206, and a fourth row 208. The rows 202, 204, 206, 208 correspond to the terminal portion 101 of the pads 102, as can be seen. Additional rows can be used in other embodiments.

The first row 202 and the second row 204 are staggered relative to one another and the extended portion 103 of the pads 102 in the first row 202 and the second row 204 extend such that terminating ends of each extended portion 103 are aligned to form a row 302 of terminating ends that is substantially parallel with the first row 202 and the second row 204. The third row 206 and the fourth row 208 are staggered relative to one another and the extended portion 103 of the pads 102 in the third row 206 and the fourth row 208 extend such that terminating ends (e.g., land area 305) of each extended portion 103 are aligned to form another row 304 of terminating ends that is substantially parallel with the third row 206 and the fourth row 208. The rows 302 and 304 are substantially parallel to one another. Although the depicted extended portion 103 is substantially linear, other non-linear shapes can be used for the extended portion 103 in other embodiments.

As can be seen, the extended portion 103 includes a land area 305 to facilitate connection of the one or more bonding wires 110 to the extended portion 103 and a trace region 307 to facilitate routing between the pads 102, the land area 305 being wider than the trace region 307. For example, the wider land area 305 may be configured to receive the one or more bonding wires 110, as can be seen. Although the wider land area 305 is depicted to be circular, other shapes can be used for the wider land area 305 in other embodiments. The extended portion 103 may facilitate shortening of a wire length of the one or more bonding wires 110 or allow placement of pads 102 in locations that are out of reach by a bonding wire (e.g., exceeds a manufacturing capability of wire length).

Figure 4:
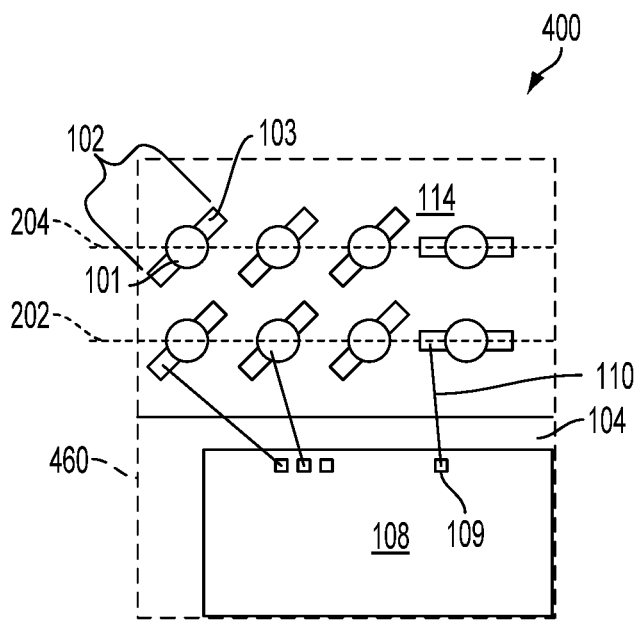
FIG. 4 schematically illustrates a top view of a portion of an electronic package assembly having another pad configuration.

FIG. 4 schematically illustrates a top view of a portion 460 of an electronic package assembly 400 having another pad configuration. The electronic package assembly 400 includes a plurality of pads 102 arranged in a first row 202 and a second row 204. Additional rows can be used in other embodiments.

The pads 102 include a terminal portion 101 and an extended portion 103, the extended portion 103 extending in opposing directions away from the terminal portion 101, as can be seen. The extended portion 103 may extend in a single direction away from the terminal portion 101 rather than extending in two opposing directions away from the terminal portion 101. In some embodiments, the extended portion 103 extends in a direction that is substantially parallel to a terminating edge of the one or more dies 108, the terminating edge being adjacent and parallel to the first row 202 of pads 102. In other embodiments, the extended portion 103 extends in a direction that is not parallel and not perpendicular to the adjacent, terminating edge of the one or more dies 108. The pads in the first row 202 and the second row 204 are not staggered relative to one another.

The extended portion 103 can be configured to extend in a direction that is not perpendicular to the adjacent, terminating edge of the one or more dies 108 to increase flexibility of selecting a bond location (e.g., bonding wire angle, clearance). In an embodiment, the extended portion 103 extends in a direction that is not perpendicular the first row 202 and/or the second row 204, as can be seen, to provide a desired bonding wire angle or clearance. The one or more bonding wires 110 can be coupled to the terminal portion 101 and/or the extended portion 103 of the pads 102.

Figure 5:
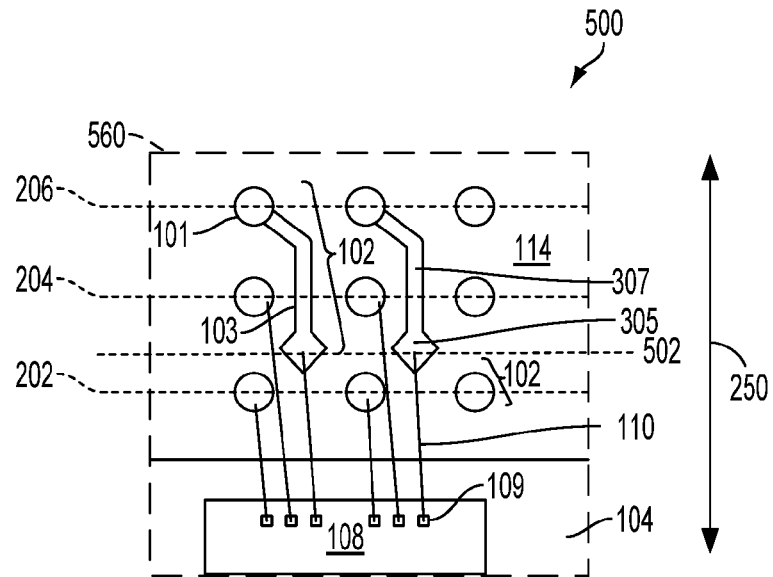
FIG. 5 schematically illustrates a top view of a portion of an electronic package assembly having another pad configuration.

FIG. 5 schematically illustrates a top view of a portion 560 of an electronic package assembly 500 having another pad configuration. The electronic package assembly 500 includes a plurality of pads 102 arranged in a first row 202, a second row 204, and a third row 206. Additional rows can be used in other embodiments.

The rows 202, 204, 206 are not staggered relative to one another. That is, the terminal portions 101 of the pads 102 in the rows 202, 204, 206 are aligned in a direction that is substantially perpendicular to the rows 202, 204, 206. The direction that is substantially perpendicular to the rows 202, 204, 206 is indicated by arrow 250. In such a case, the extended portion 103 of the pads 102 may extend in a non-linear fashion between pads 102 of a row that is closer to the die pad 104 or the one or more dies 108, as can be seen. For example, in the depicted embodiment, the extended portion 103 of the pads 102 in the third row 206 extends in a non-linear fashion between pads 102 of the second row 204 such that a terminating end (e.g., land area 305) of the extended portion 103 is disposed between terminal portions 101 of pads 102 disposed in the first row 202 and the second row 204. In some embodiments each extended portion 103 of the pads 102 extends such that terminating ends (e.g., land area 305) of each extended portion 103 are aligned to form a row 502 of terminating ends that is substantially parallel with the first row 202 of pads and the second row 204 of pads.

As can be seen, the extended portion 103 includes a land area 305 to facilitate connection of the one or more bonding wires 110 to the extended portion 103 and a trace region 307 to facilitate routing between the pads 102, the land area 305 being wider than the trace region 307. For example, the wider land area 305 may be configured to receive the one or more bonding wires 110, as can be seen. Although the wider land area 305 is depicted to be rectangular, other shapes can be used for the wider land area 305 in other embodiments. The configuration of pads 102 of the electronic package assembly 500 allows utilization of the area between pads 102 for multiple bonding or increased flexibility in selecting a bonding location for the one or more bonding wires.

Figure 6:
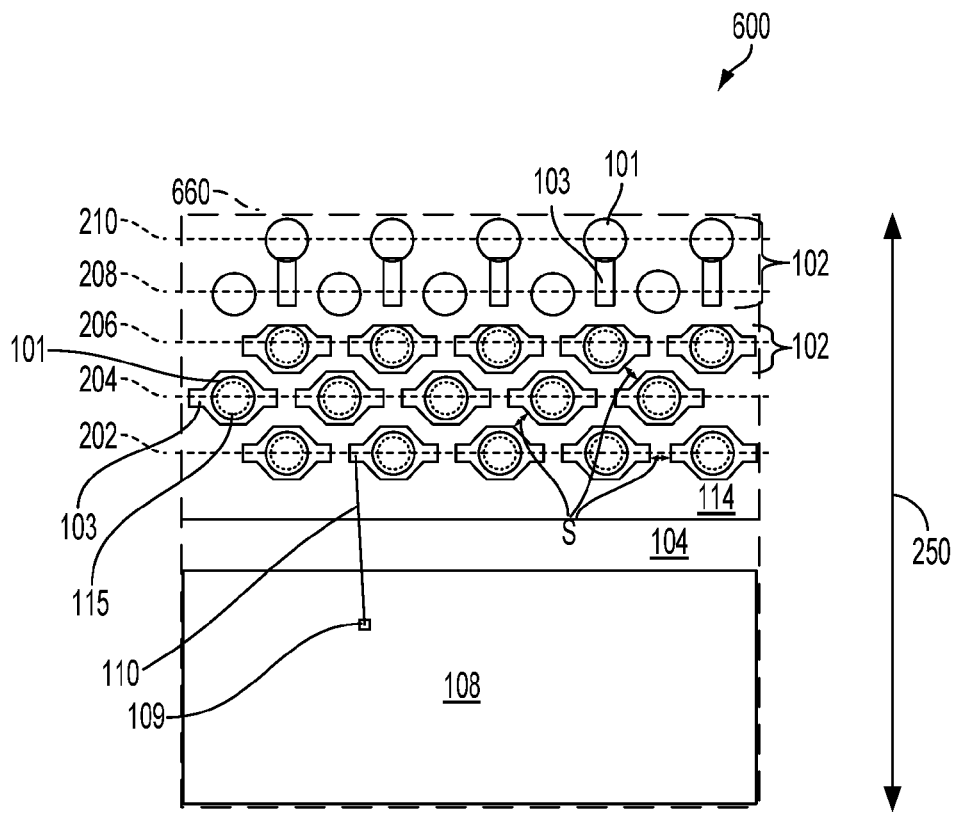
FIG. 6 schematically illustrates a top view of a portion of an electronic package assembly having another pad configuration.

FIG. 6 schematically illustrates a top view of a portion 660 of an electronic package assembly 600 having another pad configuration. The electronic package assembly 600 includes a plurality of pads 102 arranged in a first row 202, a second row 204, a third row 206, a fourth row 208, and a fifth row 210. The rows 202, 204, 206, 208, 210 are staggered relative to one another, as can be seen. Additional rows can be used in other embodiments.

The pads 102 in the first row 202, the second row 204, and the third row 206 include an extended portion 103 that extends in substantially all directions away from the terminal portion 101 on a plane that includes the pads 102. The plane may, for example, be co-planar with a surface (e.g., the sacrificial layer described in connection with method 800 of FIG. 8) on which the pads 102 are formed or a surface (e.g., the solder mask layer 114) to which the pads 102 are coupled.

As depicted, the extended portion 103 extends from the terminal portion 101 such that a constant minimum space, S, or distance separates each part (e.g., the extended portion 103) of the respective pads 102 from one another. The minimum space, S, can be, for example, a minimum design distance between electrically conductive features (e.g., metal features) of a redistribution layer (e.g., the one or more redistribution layers 106 of FIG. 1) including the pads 102. For example, positioning electrically conductive features such as pads 102 at a distance smaller than the minimum space S may not even be feasible from a manufacturing standpoint due to technology constraints or reliability issues such as electrical shorting between pads. In the depicted embodiment, the extended portion 103 extends further in a direction that is parallel to the rows (e.g., first row 202, second row 204, etc.) than in a direction that is perpendicular to the rows. A direction that is perpendicular to the rows is indicated by arrow 250. One or more openings 115 are depicted in dashed form to indicate that the one or more openings 115 underlie the terminal portion 101 of the pads 102.

Multiple different structures for the pads 102 can be used in a single electronic package assembly 200. The fourth row 208 includes pads 102 that only have a terminal portion 101. The fifth row 210 includes pads 102 that include a terminal portion 101 and an extended portion 103 that extends towards the die pad 104 or the one or more dies 108. Other configurations using multiple different structures for the pads 102 can be used in other embodiments. For example, embodiments for structures and configurations for pads 102 described in connection with FIGS. 1-7 may be suitably combined in a single electronic package assembly in some embodiments.

Figure 7:
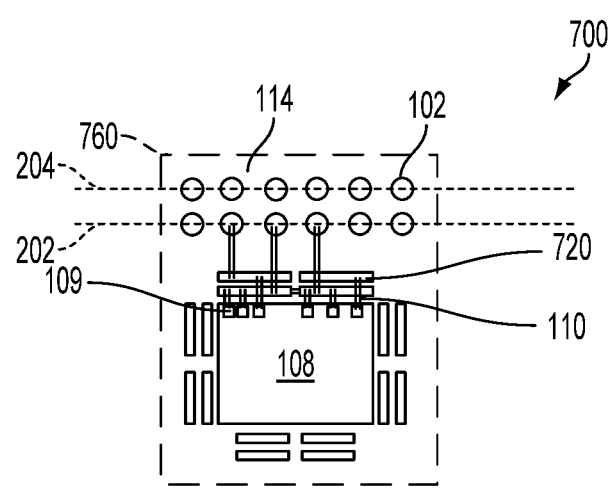
FIG. 7 schematically illustrates a top view of a portion of an electronic package assembly having one or more ring segment structures.

FIG. 7 schematically illustrates a top view of a portion 760 of an electronic package assembly 700 having one or more ring segment structures 720. The electronic package assembly 700 includes a plurality of pads 102 that comport with embodiments for any of the pads 102 described herein. The pads 102 are arranged in a first row 202 and a second row 204. Additional rows can be used in other embodiments.

The one or more ring segment structures 720 are configured to provide power and/or ground connections for the one or more dies 108. According to various embodiments, the one or more ring segment structures 720 are disposed between the first row 202 and the one or more dies 108, as can be seen.

One or more bonding wires 110 are used to electrically couple bond pads 109 of the one or more dies 108 to the one or more ring segment structures 720 and the pads 102, as can be seen. The one or more bonding wires 110 can further be used to electrically couple separate ring segment structures of the one or more ring segment structures 720 together.

As can be seen, the one or more ring segment structures 720 are generally elongate in a direction that is substantially parallel with an adjacent row (e.g., first row 202) or a terminating edge of the one or more dies 108, the terminating edge being adjacent to the one or more ring segment structures 720. The one or more ring segment structures 720 can be disposed along one or more (e.g., all) terminating edges of the one or more dies 108, as can be seen, to substantially surround the one or more dies 108. In an embodiment, the one or more ring segment structures 720 are part of a same metal layer (e.g., redistribution layer 106 of FIG. 1) used to form the pads 102 and/or a die pad (e.g., the die pad 104 of FIG. 6).

The one or more ring segment structures 720 provide flexibility of using a same design for multiple or various types of devices (e.g., one or more dies 108). That is, the use of the one or more ring segment structures 720 allows a single layout for an electronic package assembly to be useable for multiple different applications.

Although the depicted portions 260, 360, 460, 560, 660, 760 of the respective electronic package assemblies 200, 300, 400, 500, 600, 700 only show a configuration of the pads 102 adjacent to one of the terminating edges of the one or more dies 108, to be clear, the pads 102 and the bond pads 109 can be similarly configured along other or all terminating edges of the one or more dies 108. It should be understood that the various pad configurations described herein may be used in a quad flat no-lead (QFN) package or other types of packages.

Figure 8:
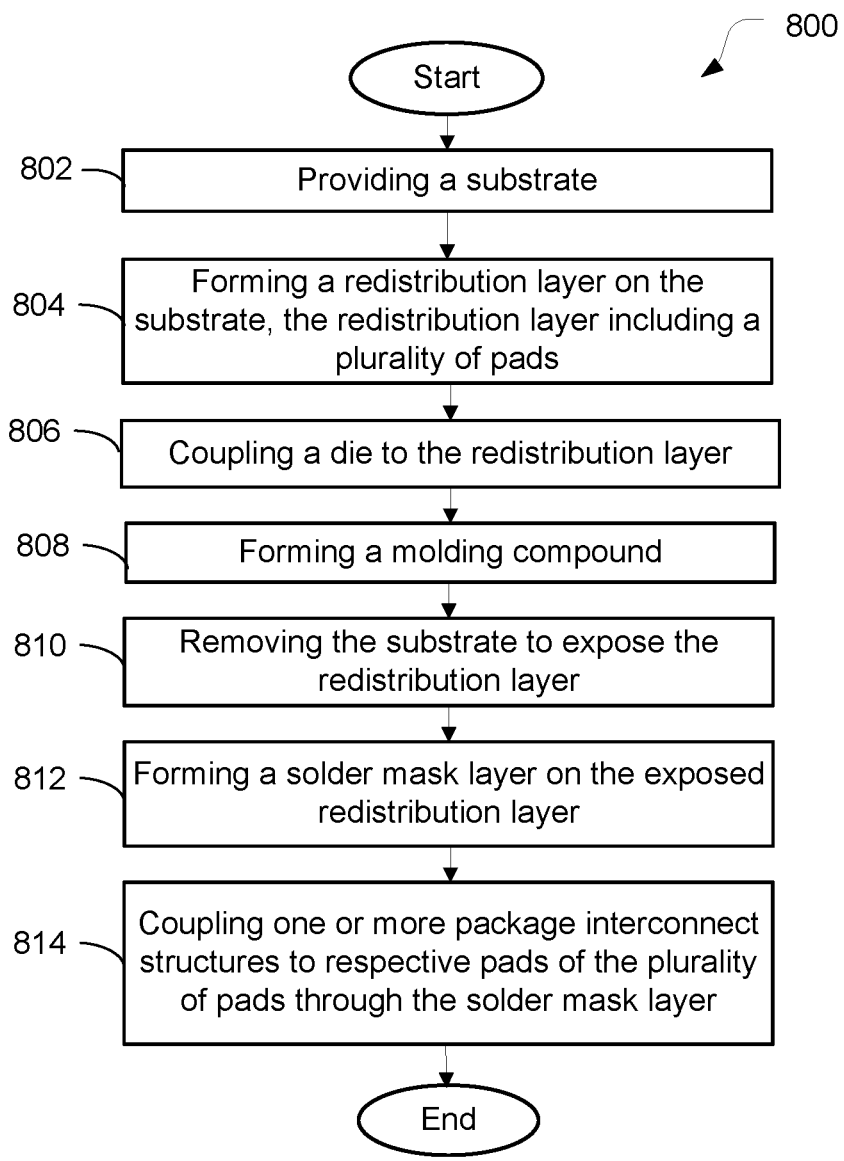
FIG. 8 schematically illustrates a process flow diagram of a method to fabricate an electronic package assembly described herein.

FIG. 8 schematically illustrates a process flow diagram of a method 800 to fabricate an electronic package assembly (e.g., the electronic package assembly 100) described herein. At 802, the method 800 includes providing a substrate. The substrate includes a surface upon which one or more redistribution layers (e.g., the one or more redistribution layers 106 of FIG. 1) are formed. The substrate is a sacrificial substrate that is removed in a final electronic package assembly. The final electronic package assembly is an assembly that is ready for shipping or use by a customer. The substrate can include a variety of suitable materials. In an embodiment, the substrate comprises a metal such as copper.

At 804, the method 800 further includes forming a redistribution layer (e.g., the one or more redistribution layers 106 of FIG. 1) on the substrate, the redistribution layer including a plurality of pads (e.g., the pads 102 of FIG. 1). The redistribution layer may further include a die pad (e.g., the die pad 104 of FIG. 1). The redistribution layer can be formed by any suitable technique including, for example, electroplating, deposition, attachment, patterning (e.g., etching) the substrate, or other suitable processes to provide structures or configurations of pads as described herein.

At 806, the method 800 further includes coupling a die (e.g., the one or more dies 108 of FIG. 1) to the redistribution layer. In an embodiment, an inactive surface of the die is coupled to the die pad using a die adhesive and an active surface of the die is electrically coupled to the plurality of pads formed on the substrate using one or more bonding wires (e.g., the one or more bonding wires 110 of FIG. 1). Other suitable techniques to couple the die to the redistribution layer can be used in other embodiments.

At 808, the method 800 further includes forming a molding compound (e.g., the molding compound 112 of FIG. 1). The molding compound is generally formed to encapsulate the die, the one or more bonding wires, and the redistribution layer. According to various embodiments, the molding compound is formed by depositing a resin (e.g., a thermosetting resin) in solid form (e.g., a powder) into a mold and applying heat and/or pressure to fuse the resin. Other well-known techniques for forming the molding compound can be used in other embodiments.

At 810, the method 800 further includes removing the substrate to expose the redistribution layer. The substrate can be removed, for example, by selectively removing the substrate material using a process such as an etch process. The molding compound can be used as a mechanical carrier during an etch process that removes the substrate.

At 812, the method 800 further includes forming a solder mask layer (e.g., the solder mask layer 114 of FIG. 1) on the exposed redistribution layer. The solder mask layer can be deposited by any well-known process. One or more openings (e.g., the one or more openings 115 of FIG. 1) can be formed in the solder mask layer, for example, using any well-known patterning or expose/develop process.

At 814, the method 800 further includes coupling one or more package interconnect structures (e.g., the one or more package interconnect structures 116 of FIG. 1) to respective pads of the plurality of pads through the solder mask layer. The one or more package interconnect structures (e.g., solder balls) can be formed or placed using any suitable deposition technique. In an embodiment, the one or more package interconnect structures are attached to a terminal portion (e.g., the terminal portion 101 of FIG. 1) of the pad through the one or more openings formed in the solder mask layer.

Subsequent to coupling the one or more package interconnect structures, the electronic package assembly (e.g., the electronic package assembly 100 of FIG. 1) can be singulated by, e.g., sawing and packaged for shipping for customer use. In packaging, the electronic package assembly may be mounted on a printed circuit board (e.g., the printed circuit board 150 of FIG. 1) using the one or more package interconnect structures to route the electrical signals of the one or more dies to the printed circuit board.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description may use perspective-based descriptions such as up/down, over/under, and/or top/bottom. Such descriptions are merely used to facilitate the discussion and are not intended to restrict the application of embodiments described herein to any particular orientation.

For the purposes of the present disclosure, the phrase "A/B" means A or B. For the purposes of the present disclosure, the phrase "A and/or B" means "(A), (B), or (A and B)." For the purposes of the present disclosure, the phrase "at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This disclosure is intended to cover any adaptations or variations of the embodiments discussed herein. Therefore, it is manifestly intended that embodiments described herein be limited only by the claims and the equivalents thereof.

What is claimed is:

1. An electronic package assembly comprising:
    a solder mask layer, the solder mask layer having at least one opening;
    a plurality of pads coupled to the solder mask layer, wherein at least one pad of the plurality of pads includes (i) a first side, (ii) a second side disposed opposite to the first side, (iii) a terminal portion and (iv) an extended portion, wherein the first side at the terminal portion is configured to receive a package interconnect structure through the at least one opening in the solder mask layer, wherein the package interconnect structure is configured to route electrical signals between a die and an electronic device that is external to the electronic package assembly, and wherein the second side at the extended portion is configured to receive one or more electrical connections from the die; and
    a die pad configured to receive the die;
    wherein the plurality of pads includes a first row of pads,
    wherein the first row of pads is disposed adjacent to the die pad,
    wherein the plurality of pads includes a second row of pads disposed (i) adjacent to the first row of pads and (ii) parallel to the first row of pads,
    wherein the first row of pads is disposed closer to the die pad than the second row of pads, and
    wherein the extended portion of the at least one pad extends in a direction that is not perpendicular to the first row of pads.

2. The electronic package assembly of claim 1, wherein the at least one pad is disposed in the first row of pads or the second row of pads.

3. The electronic package assembly of claim 1, wherein (i) the first row of pads and (ii) the second row of pads are not staggered relative to one another.

4. The electronic package assembly of claim 1, wherein:
    the plurality of pads includes a third row of pads disposed (i) adjacent to the second row of pads and (ii) parallel to the second row of pads;
    the second row of pads is disposed closer to the die pad than the third row of pads;
    the plurality of pads includes a fourth row of pads disposed (i) adjacent to the third row of pads and (ii) parallel to the third row of pads;
    the third row of pads is disposed closer to the die pad than the fourth row of pads; and
    the at least one pad is disposed in one of (i) the third row of pads or (ii) the fourth row of pads.

5. The electronic package assembly of claim 1, wherein the extended portion is substantially linear.

6. The electronic package assembly of claim 1, wherein the extended portion extends in two opposing directions away from the terminal portion.

7. The electronic package assembly of claim 1, further comprising:
    the die disposed on the die pad,
    wherein the die includes a bond pad that is electrically coupled to the at least one pad using a bonding wire.

8. The electronic package assembly of claim 7, wherein the bonding wire is attached to (i) the bond pad and (ii) the extended portion of the at least one pad.

9. The electronic package assembly of claim 7, wherein:
    the die pad is a ground pad to provide a ground connection for the die; and
    the die is electrically coupled to the ground pad using another bonding wire.

10. The electronic package assembly of claim 7, wherein:
the extended portion extends in a direction that is not perpendicular to a terminating edge of the die; and
the terminating edge of the die is (i) adjacent to the first row of pads and (ii) parallel to the first row of pads.

11. The electronic package assembly of claim 10, wherein the extended portion extends in a direction that is not parallel to the terminating edge of the die.

12. The electronic package assembly of claim 7, further comprising:
a molding compound disposed to substantially encapsulate the die and the bonding wire, wherein the molding compound is disposed on the second side of the at least one pad; and
the package interconnect structure, wherein the package interconnect structure is coupled to the terminal portion of the at least one pad through the at least one opening in the solder mask layer.

13. The electronic package assembly of claim 1, wherein (i) the die pad and (ii) the plurality of pads are part of a same metal layer.

14. The electronic package assembly of claim 1, wherein the electronic device that is external to the electronic package assembly comprises a printed circuit board.

15. A method of fabricating an electronic package assembly, comprising:
providing a sacrificial substrate; and
forming a redistribution layer on the sacrificial substrate, wherein the redistribution layer includes a plurality of pads and a die pad configured to receive a die, wherein at least one pad of the plurality of pads includes (i) a first side, (ii) a second side disposed opposite to the second side, (iii) a terminal portion and (iv) an extended portion, wherein the first side at the terminal portion is coupled to the sacrificial substrate, and
wherein the second side at the extended portion is configured to receive one or more electrical connections from the die;
wherein the plurality of pads includes a first row of pads,
wherein the first row of pads is disposed adjacent to the die pad,
wherein the plurality of pads includes a second row of pads disposed (i) adjacent to the first row of pads and (ii) parallel to the first row of pads,
wherein the first row of pads is disposed closer to the die pad than the second row of pads, and
wherein the extended portion of the at least one pad extends in a direction that is not perpendicular to the first row of pads.

16. The method of claim 15, further comprising:
coupling an inactive surface of the die to the die pad; and
electrically coupling an active surface of the die to the extended portion of the at least one pad using a bonding wire.

17. The method of claim 16, further comprising:
forming a molding compound to encapsulate (i) the die and (ii) the bonding wire.

18. The method of claim 17, further comprising:
removing the sacrificial substrate to expose the redistribution layer.

19. The method of claim 18, wherein the molding compound is used as a mechanical carrier substrate during the removing of the sacrificial substrate.

20. The method of claim 18, further comprising:
forming a solder mask layer on the redistribution layer;
forming one or more openings in the solder mask layer; and
coupling a package interconnect structure to the terminal portion of the at least one pad through the one or more openings in the solder mask layer.

* * * * *